United States Patent [19]
Higginbotham et al.

[11] Patent Number: 4,469,161
[45] Date of Patent: Sep. 4, 1984

[54] METHOD OF AND MOULD FOR MAKING A CAST SINGLE CRYSTAL

[75] Inventors: Gordon J. S. Higginbotham, Darley Abbey; John R. Marjoram, Coxbench; Frederick J. Horrocks, Spondon, all of England

[73] Assignee: Rolls-Royce Limited, London, England

[21] Appl. No.: 449,529

[22] Filed: Dec. 13, 1982

[30] Foreign Application Priority Data

Dec. 23, 1981 [GB] United Kingdom ............... 8138761

[51] Int. Cl.$^3$ ...................... B22D 25/00; B22C 9/08; B22C 9/04
[52] U.S. Cl. ................ 164/122.2; 164/134; 164/358; 164/361
[58] Field of Search .................. 164/122.2, 125, 127, 164/134, 361, 358

[56] References Cited

U.S. PATENT DOCUMENTS

| | | | |
|---|---|---|---|
| 3,584,676 | 6/1971 | Busquet et al. | 164/122.2 |
| 3,754,592 | 8/1973 | Mullen | 164/127 X |
| 3,815,661 | 6/1974 | Curran et al. | 164/134 |
| 3,893,917 | 7/1975 | Pryor et al. | 164/134 X |
| 3,915,761 | 10/1975 | Tschinkel et al. | 164/127 X |

*Primary Examiner*—Nicholas P. Godici
*Assistant Examiner*—J. Reed Batten, Jr.
*Attorney, Agent, or Firm*—Cushman, Darby & Cushman

[57] ABSTRACT

A method and a mould for making a cast single crystal in which the casting mould comprises a main casting chamber and a seed crystal mounted at or adjacent the entry aperture to this chamber. The charge of molten metal is arranged to flow over the crystal to produce melting of its upper surface. The molten metal filling the mould is then arranged to solidify progressively from the seed crystal, which then imposes its own structure and orientation on the solidifying metal.

11 Claims, 6 Drawing Figures

METHOD OF AND MOULD FOR MAKING A CAST SINGLE CRYSTAL

BACKGROUND OF THE INVENTION

This invention relates to a method of making a cast single crystal, to the mould used in this method and to a cast object made using this method or mould.

The manufacture of cast single crystals has been practised for many years, initially as a source of laboratory specimens and more recently to provide objects such as single crystal turbine blades which take advantage of the improved and anistropic properties available with this form of metal. The method of manufacture has varied over the years; initially a seeding technique was used for laboratory purposes but while suitable for the labour-intensive, small scale manufacture needed for this environment, the technique was not thought to be suitable for large scale construction or semi-automated manufacture.

The first alternative to be considered involved the use of a starter chamber in which molten metal is caused to solidify in a columnar grained form, and a restrictor of small opening which is intended to allow only one grain to grow into the mould cavity proper. This was found not to select one grain effectively, and an inclined passage selector between the starter and the main cavity was proposed. However, since face-centred cubic crystal materials will grow in their $<100>$ directions preferentially, a passage way lying in a single plane will still be able to allow two or more crystals to grow through if the $<100>$ directions lie in the plane of the passage way.

The final development of this selector concept was therefore to use a helical passage which has been found to be successful in blocking the passage of all but one grain into the main mould cavity. However, this technique has the disadvantage that the orientation of the crystal produced is only determined in one direction. This is the direction of growth of the crystal, normally determined by the heat flow from the mould. This direction will correspond, in the most common face-centred cubic case, to the $<0,0,1>$ direction. At right angles to this direction the orientation of the crystal will be random.

This randomness can have undesirable consequences. Thus the vibrational characteristics of a component will be dependent on the physical properties such as the elastic and shear moduli. Since a face-centred cubic single crystal is highly anisotropic it is predictable that the vibration characteristics of a component, e.g. a turbine blade for a gas turbine engine, will depend upon the crystal orientation about the blade stacking axis. For some objects such as blades, the random variation in vibrational characteristics due to orientation about the axis may be embarrassing and may prevent exploitation of the properties of the single crystal to the full.

If a speed crystal is used instead of a selector to produce the single crystal casting, the longitudinal and transverse orientations of the single crystal may be predetermined by arranging the orientation of the seed crystal. In order to ensure epitaxial growth from a seed it is essential that nucleation does not occur from other features such as mould walls. To ensure that this does not happen the mould must be heated above the melting point of the metal, and clearly the seed crystal must not melt completely. In the past it has been difficult to reconcile these conflicting requirements in a manner which satisfies the needs of a production process. We have invented a method, and a mould for use in this method, which enables the use of a seed crystal while reducing the danger of extraneous nucleation.

SUMMARY OF THE INVENTION

According to the present invention a method of making a cast single crystal comprises providing a mould having a main mould cavity and an entry aperture to said main mould cavity, mounting a seed crystal in, or adjacent to said entry aperture, pouring a charge of suitable molten metal into said mould through said entry aperture in such a way that the molten metal flows over the seed crystal and into said main cavity, imparting sufficient heat to raise the shell and seed crystal tip above the melting point of the alloy, and causing epitaxial growth of the molten metal from said seed crystal toward the opposite extremity of the mould.

Normally the seed crystal will be mounted at the bottom of the mould, in contact with a water-cooled chill. The chilling effect ensures that this local area of the assembly remains below the alloy melting point and the heat imparted by the volume of metal flow raises mould and seed tip temperature above the melting point. This chill together with progressive withdrawal of the mould from a furnace serve to induce the progressive solidification required by the epitaxial growth from the partially reheated seed crystal.

The invention also comprises a mould for use in the manufacture of a cast single crystal, the mould comprising a main mould cavity, an entry aperture for allowing the passage of molten metal into the mould cavity, and a seed crystal cavity adapted to hold a seed crystal and located at or adjacent to the entry aperture where the metal to fill the mould cavity will flow over the seed crystal to ensure potential melt back.

BRIEF DESCRIPTION OF THE DRAWING

The invention will now be particularly described, merely by way of example, with reference to the accompanying drawings in which.

DETAILED DESCRIPTION OF THE INVENTION

Figure 1:
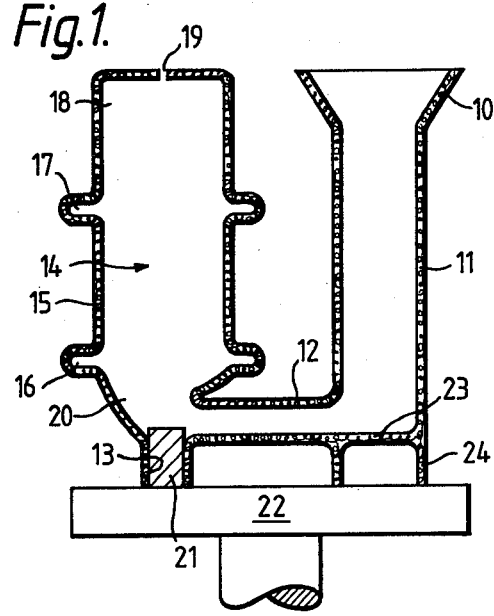
FIG. 1 is a sectional view through a mould in accordance with the invention and for use in the method of the invention.

The mould of FIG. 1 is made of the normal ceramic shell mould material well-known and widely used in the precision casting art. The novelty of the mould resides in its shape and the provision it makes for a seed crystal, which is illustrated as being in position in the mould.

The mould comprises a pouring cup 10, a down pole 11, a laterally extending runner or entry passage 12, a seed crystal chamber 13 and a main casting cavity 14. These items are enumerated in the sequence in which molten metal poured into the mould will flow. In the present instance the main casting cavity 14 is illustrated as having the shape required to form a blade for a gas turbine engine, and it has an aerofoil shaped portion 15, inner and outer platform portions 16 and 17 and a root portion 18. The root portion 18 forms the uppermost part of the mould and is provided with a vent 19 to allow the metal to rise up the mould cavity. At the other (lower) extremity of the main mould cavity there is a transition chamber 20 into which the seed crystal 21 protrudes.

At its lowest extremity the seed crystal chamber 13 is open so that the seed crystal can come into contact with the base on which the mould stands. In this case this base comprises a water-cooled chill 22. It will be seen that the seed crystal is the only part of the metal in contact with the chill; the remainder of the mould is constructed so as to ensure that the flow of metal which fills the mould is kept out of contact with the chill. Thus the down pole 11 is optionally blanked off at 23 and the remaining part of the pole at 24 acts as a spacer which supports the metal-carrying part of the pole and the passage 12 away from the chill.

The final item of note in the mould is the seed crystal 21. This is shown as rectangular in section, and may in fact comprise any convenient shape such as a cylindrical or a rectangular block. The seed crystal will normally be formed from the same material as the object to be cast, and its orientation will be carefully predetermined since the orientation of the cast object will mirror that of the seed. This is true of orientation both longitudinally of the object (the blade in this case) and transversely of it; as explained above this enables the transverse orientation to be determined and therefore enables the vibrational properties to be closely controlled.

It will be appreciated that the size, shape and volume of the seed crystal must be controlled such that the superheat from the metal flow will be sufficient to cause partial melting of the seed crystal without fully remelting i.e. equilibrium conditions are set up and withdrawal then continues the solidification.

Figure 2:
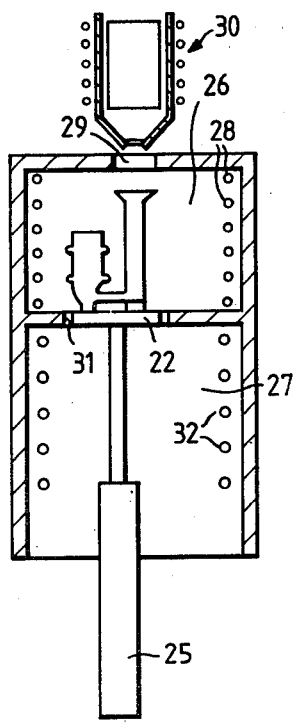
FIGS. 2, 3 and 4 illustrate successive stages of the method of the invention.
Figure 3:
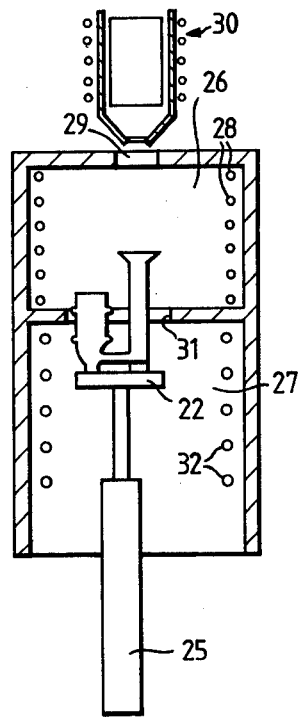
Figure 4:
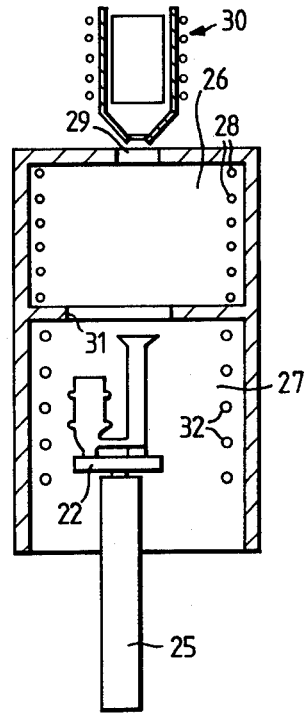

The mould is used in the apparatus shown in FIG. 2, 3 and 4 to produce a casting. As shown in FIG. 2 the mold is mounted on the chill 22 which is in turn supported on a ram 25. The ram enables the chill and mould to be moved vertically between the positions illustrated in FIGS. 2 and 4. In the FIG. 2 illustration the mould is held in the furnace chamber 26 while in FIG. 4 the mould has been lowered into a cooled withdrawal chamber 27.

The furnace chamber 26 is fairly conventional in that it comprises an insulated enclosure within which are located a plurality of electrical resistance heating elements 28. The furnace has an upper opening 29 which communicates with a bottom-pouring charge melting apparatus 30, and a lower aperture 31 through which the chill 22 may just pass. In fact the extremity of the upward motion of the ram 25 is such as to leave the chill 22 registering with and blocking the aperture 31 as shown in FIG. 1.

The withdrawal chamber 27 lies below the furnace chamber 26 and is again fairly conventional in that it comprises an insulated chamber within which are located a plurality of water cooling tubes 32. The ram 25 can withdraw the chill and mould from the heated chamber 26 into the cooled chamber 27.

Operation of the system is that the mould, with the seed crystal 21 in place, is initially held on the chill 22 in the furnace 26 (as in FIG. 2). The furnace and the major part of the mould are preheated to a temperature above the melting point of the metal to be used (normally a nickel-based superalloy); the bottom portion will be cooled by the chill to below this temperature. The bottom pouring apparatus 30 is then actuated to melt its charge of metal and to cause it to pour through the aperture 29 and into the pouring cup 10. (The detailed operation of the bottom-pouring arrangement is not set out herein, but it will be understood by those skilled in the art that the apparatus uses an induction coil to melt an ingot of metal in a crucible, the molten metal then breaching a fusible plug at the bottom of the crucible and flowing through an exit passage).

The molten metal thus flows through the cup 10 and down pole 11 into the passage 12 and then upwards through the transition chamber 20 to fill the main cavity 14. It will be noted that because the seed crystal is located at the main mould cavity, the complete charge of metal which is to fill the cavity 14 passes over the crystal. This heats the crystal, and because the molten metal has not been subject to any considerable cooling since it was melted, it has sufficient excess heat to melt the upper portion of the crystal and heat up the shell above the melting point of the metal to prevent stray nucleation. The fact that the complete charge of metal pours over the crystal also helps to provide the heat necessary for partial melting of the seed crystal.

The mould is thus filled with molten metal, which in its passage has partially melted the seed crystal. The chill 22 then operates to withdraw heat from the lower portion of the mould and simultaneously the mould and chill are gradually withdrawn from the furnace 26 into the water-cooled withdrawal chamber 27 by operation of the ram 25.

These processes, in conjunction, cause the metal filling the mould to solidify undirectionally from the seed crystal upwards. Because the seed crystal and the molten charge of metal are in intimate contact the solidifying metal will grow epitaxially from the remaining solid part of the seed crystal, i.e. it will solidify as a single crystal whose orientation in three dimensions will be the same as that of the seed crystal. This will lead to the whole mass of molten metal eventually solidifying as a single crystal, as long as there is no extraneous grain growth from other nucleating sites. Such nucleation can for instance be effected by surface discontinuities of the seed crystal or by recrystallisation of residual work in e.g. a machined surface of the crystal, and this fact and the need for the molten metal and the seed crystal to be in intimate contact make it important that the top portion of the crystal should be melted. Arranging the mould and the flow of metal in accordance with the present invention enables this partial melting to be effected and hence enables the achievement of repeatable solidification in the form of a single crystal.

Once the solidification of the metal in the mould is complete, the mould can be removed in conventional manner and the cast, single crystal object can be machined as required (for instance the metal from the down pole 11 and passage 12 will need to be removed).

In the process described above, a simple single-crystal object is made. It will be appreciated that there are a variety of more sophisticated ways in which the method of the invention could be used. Thus a cored mould could be used to produce a casting having cavities therein. Again, it is not necessary that the complete article formed should comprise a single crystal; the cast article may be treated to modify its structure or alternatively the casting process may be such as to produce only part of the cast article in single crystal form.

Figure 5:
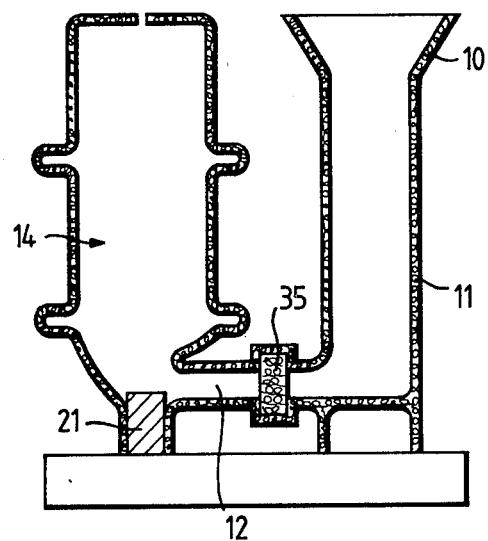
FIGS. 5 and 6 illustrate alternative moulds for use in the method.
Figure 6:
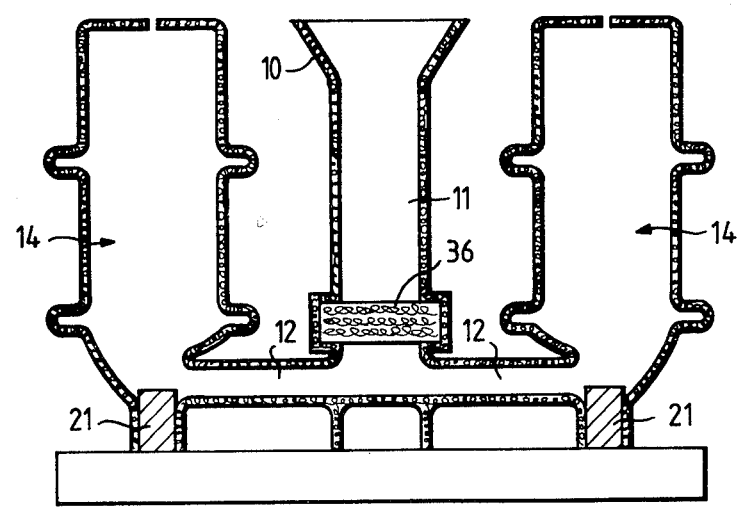

One particular way in which the basic method described above may be improved is illustrated in FIGS. 5 and 6. In both these figures the mould is basically similar to that of FIG. 1, but a filter or filters are provided through which the molten metal pours before entering the main mould cavity. In FIG. 5 the filter 35 which is a ceramic foam filter, is located in the laterally extending passage 12. In FIG. 6 an arrangement is shown where a single down pole 11 feeds a number (two are illustrated) of main mould cavities. Here the filter 36 is shown as being located in the down pole so that a single filter clears the charge of metal for all the moulds. Clearly these two alternatives could be permutated so that a single mould cavity could have the filter in its down pole or a multiple mould cavity system could have the filters in each lateral passage.

It should be noted that the filters not only filter the molten metal but also reduce its velocity of flow, hence providing a smoother flow and less turbulence and scouring of the mould interior.

It will be appreciated that although specifically described above in connection with the manufacture of a blade cast from a nickel-based alloy and for use in a gas turbine engine, other alloys can be used and other objects cast.

We claim:

1. A method of making a cast single crystal comprising the steps of:
   (a) providing a mould having a main mould cavity and an entry aperture of said main mould cavity,
   (b) mounting a seed crystal in or adjacent to said entry aperture, the mould and the seed crystal resting on a chill adapted to cool said seed crystal and the bottom of said mould
   (c) pouring a charge of suitable molten metal into said mould through said entry apertures in such a way that the molten metal flows in succession first over the seed crystal and then into said main mould cavity thereby imparting sufficient heat to raise the mould and seed crystal tip to a temperature above the melting point of the metal, and causing progressive solidification of the molten metal from said seed crystal towards the opposite extremity of the mould.

2. A method as claimed in claim 1 and comprising effecting said progressive solidification by progressive withdrawal of said mould from a furnace.

3. A method as claimed in claim 2 and comprising withdrawing said mould progressively from said furnace into a cooled withdrawal chamber.

4. A method as claimed in claim 1 and comprising filtering the metal before it enters said main mould cavity.

5. A mould for use in the manufacture of a cast single crystal, said mould comprising a main cavity, an entry aperture for said main mould cavity, a seed cavity adapted to hold a seed crystal in or adjacent to said entry aperture, the seed crystal cavity being located in or adjacent to said entry aperture so as to allow flow firstly over said seed crystal tip and then into the main mould cavity, and passage means adapted to allow the flow of molten metal over said seed crystal and into said main mould cavity.

6. A mould claimed in claim 5 and comprising a feed passage extending sideways to communicate with said entry aperture.

7. A mould as claimed in claim 6 and comprising a down pole communicating with said feed passage.

8. A mould as claimed in claim 7 and in which a plurality of mould cavities and feed passages communicate with a single said down pole.

9. A mould as claimed in claim 5 and comprising a ceramic foam filter through which the charge of molten metal is directed.

10. A mould as claimed in claim 9 and in which said ceramic foam filter extends across a feed passage extending sideways to connect with said entry aperture.

11. A mould as claimed in claim 9 and in which said ceramic foam filter extends across a down pole which communicates with a feed passage extending sideways to connect with said entry aperture.

* * * * *